United States Patent [19]
Yoshikawa et al.

[11] Patent Number: 4,567,470
[45] Date of Patent: Jan. 28, 1986

[54] TOUCH SENSING DEVICE

[75] Inventors: Kazuo Yoshikawa; Hisashi Yamaguchi; Toru Asano, all of Kawasaki, Japan

[73] Assignee: Fujitsu Limited, Kanagawa, Japan

[21] Appl. No.: 488,399

[22] Filed: Apr. 25, 1983

[30] Foreign Application Priority Data

Apr. 30, 1982 [JP] Japan .................................. 57-73785

[51] Int. Cl.$^4$ .............................................. G06F 3/02
[52] U.S. Cl. .......................... 340/365 C; 200/DIG. 1; 340/365 S
[58] Field of Search ............ 340/365 C, 365 S, 365 E, 340/712; 200/DIG. 1; 361/288, 290, 292; 400/479.1

[56] References Cited

U.S. PATENT DOCUMENTS

| | | | |
|---|---|---|---|
| 3,691,555 | 9/1972 | Looschen | 340/365 S |
| 4,305,135 | 12/1981 | Dahl | 340/365 C |
| 4,413,252 | 11/1983 | Tyler | 340/365 C |

OTHER PUBLICATIONS

IBM Technical Disclosure Bulletin, Irwin, vol. 25, No. 8, Jan. 1983, p. 4097.
IBM Technical Disclosure Bulletin, Rowe, vol. 27, No. 4A, Sep. 1984, pp. 2012-2018.

Primary Examiner—James J. Groody
Attorney, Agent, or Firm—Armstrong, Nikaido, Marmelstein & Kubovcik

[57] ABSTRACT

A touch sensing device employing a new sensing method of the present invention is composed of the sensing portion which senses capacitance change of the touch sensing electrodes forming the touch panel, plurality of capacitance compensating capacitors which are used in common for the sensing electrodes in order to compensate fluctuation of touch sensing electrodes of the touch panel, and the ROM which is storing the data for selecting the capacitance compensating capacitors. The ON-OFF output voltage levels in the touch/non-touch conditions to the touch sensing electrodes can be equalized for each electrode and thereby the touch sensing with high accuracy can be realized by selecting the capacitance compensating capacitor by means of the ROM at the time of retrieving each touch sensing electrode.

4 Claims, 8 Drawing Figures

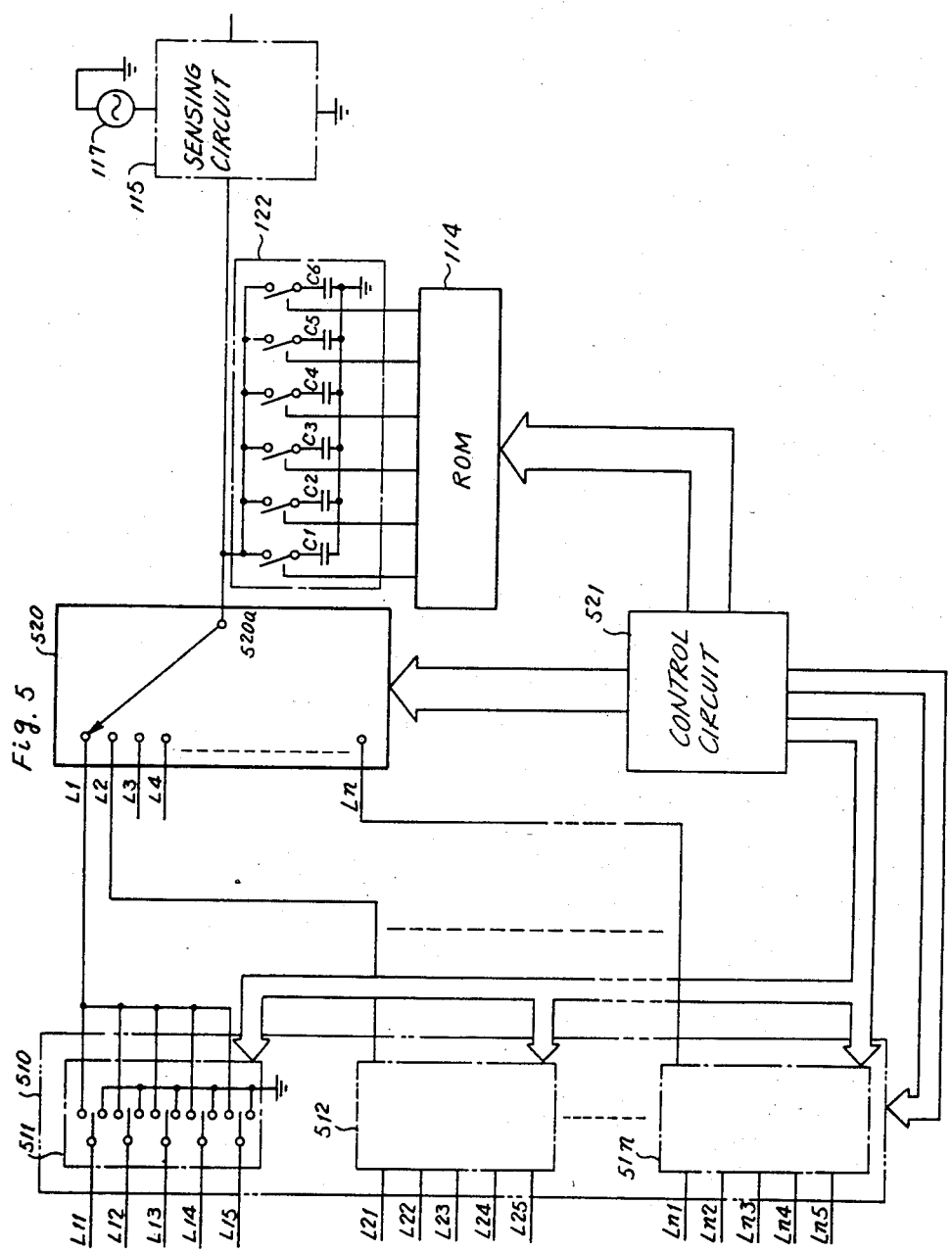

TOUCH SENSING DEVICE

BACKGROUND OF THE INVENTION

1. Field of the Invention

The present invention relates to improvement of a see-through type touch sensing device to be used for inputting data displayed at the area on the display screen and is designated by the finger to the computer system and, in more detail, to a touch sensing device which is capable of detecting change of capacitance of the touch sensing electrode occurring by finger touch.

2. Description of the Prior Arts

As a man-machine interface unit which is mounted over the display screen and is used for inputting the data in the area designated by a finger to the computer, a see-through type keyboard is a well known. It is very important consideration for such a touch keyboard to accurately and stably sense the touch condition and therefore a variety of sensing methods are proposed. One of such methods is the measurement of change of capacitance between the touch sensing electrode and the earth or ground occurring by finger touch. This technique is described in the U.S. Pat. No. 3,482,241 or U.S. application Ser. No. 437,220 filed Oct. 28, 1982.

The former describes a method of measuring change of capacitance of the touch sensing electrode by utilizing an AC bridge circuit, while the latter describes a method of measuring it by utilizing the resonant phenomenon in the resonant circuit.

The principle of a method of measuring change of capacitance of the touch sensing electrode by utilizing resonant phenomenon of the resonant circuit is briefly described hereunder. This method utilizes the fact that the resonant condition of resonant circuit changes in accordance with change of capacitance. Namely, an oscillator circuit which generates an AC signal of the predetermined frequency is connected to the touch sensing electrode and the resonant circuit which tunes to the frequency of said AC signal is connected between the touch sensing electrode and the earth. With such structure, the resonant condition of resonant circuit is changed in accordance with the touch/non-touch conditions to the touch sensing electrode and thereby an output voltage at the connecting point of the oscillating circuit and resonant circuit is changed.

However, in the existing method for detecting the touch condition to the touch sensing electrode by measuring change of capacitance at such touch sensing electrode, any fluctuation of capacity between mutual touch sensing electrodes is not considered. Therefore, resonant condition of resonant circuit is different in accordance with each touch sensing electrode to be sensed resulting in the disadvantage that an accurate and stable sensing result cannot be obtained and a resultant input error is caused.

The similar disadvantage is observed not only in the method of measuring change of capacitance by utilizing the resonant phenomenon of resonant circuit but also in the method of measuring change of capacitance by utilizing the AC bridge circuit.

Considered as the causes of different capacitance of each touch sensing electrode are error of touch sensing electrode occurring at the time of production, difference of length of the lead connected to the touch sensing electrode and fluctuation of floating capacity between the touch sensing electrodes.

SUMMARY OF THE INVENTION

An object of the present invention is to provide a touch sensing device capable of accurately and stably sensing the touch condition to the touch sensing electrode.

Another object of the invention is to provide a touch sensing device which does not easily cause mistakes in operation by compensating capacity of each touch sensing electrode so that it virtually becomes equal.

A further object of the invention is to provide a simplified compensating means capable of compensating fluctuation of capacities of all sensing electrodes using the compensation capacitors in such a number as is lesser than the number of touch sensing electrodes.

Briefly explaining, in view of attaining such objects, the present invention comprises plurality of touch sensing electrodes arranged corresponding to the locations to be sensed and the sensing portion which senses change of electrical characteristics of the pertinent touch sensing electrode on the basis of designating operation to the desired touch sensing electrode, and moreover provides, in order to compensate fluctuation of electrical characteristics of said each touch sensing electrode, plurality of compensating circuit elements which are used as the common compensating circuit elements to each touch sensing electrode and the memory elements storing the data for selecting said compensating circuit elements corresponding to the compensated value in accordance with fluctuation of electrical characteristics of said each touch sensing electrode, and also selectively connects, at the time of retrieving each touch sensing electrode, the elements corresponding to the compensated value in the compensating circuit corresponding to the retrieved touch sensing electrodes, in accordance with the data stored in the memory element.

BRIEF DESCRIPTION OF THE DRAWINGS

FIG. 5 is the block diagram of the circuit illustrating the third embodiment of the touch sensing device to which the present invention is applied.

DESCRIPTION OF THE PREFERRED EMBODIMENTS

Figure 1:
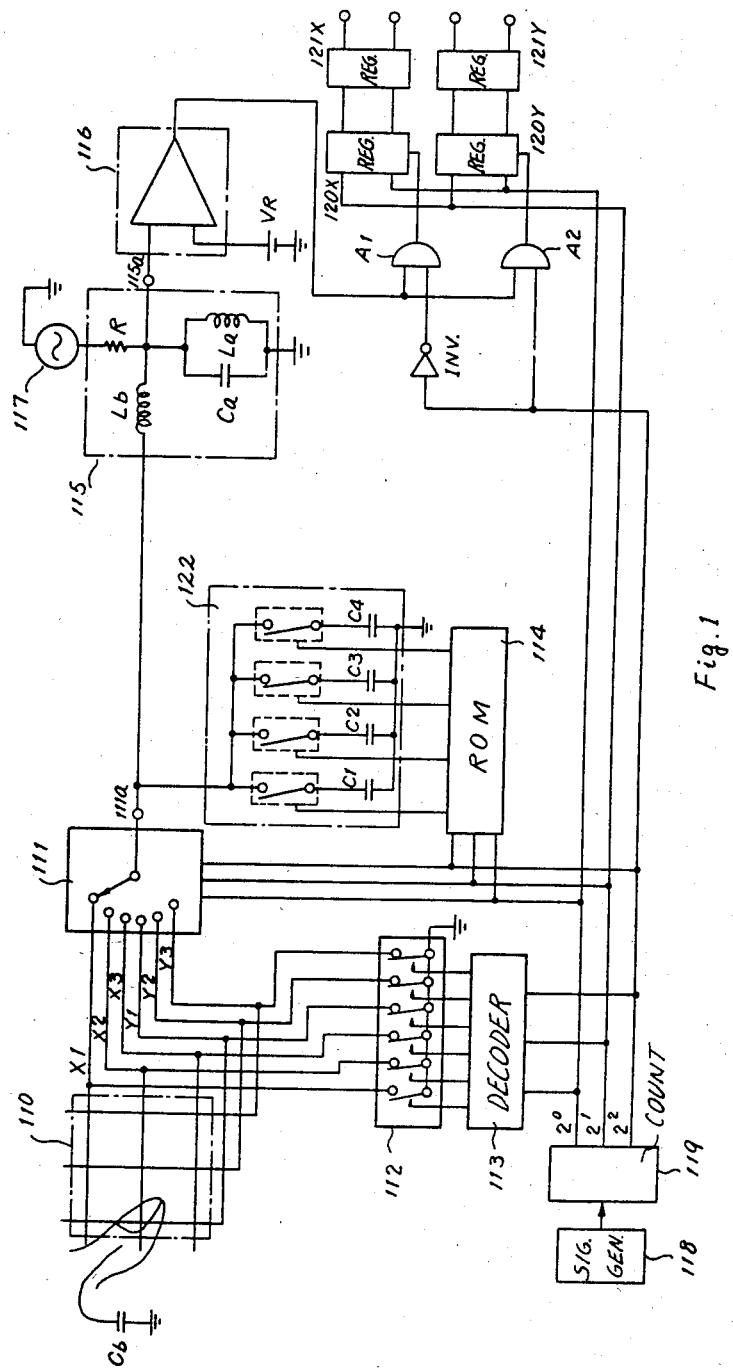
FIG. 1 is the block diagram illustrating the first embodiment of the touch sensing device to which the present invention is applied.

FIG. 1 is the block diagram illustrating the touch sensing device to which the present invention is applied.

The touch panel 110 provides respectively plurality (for example, 3×3 electrodes in the case of this figure) of X and Y sensing electrodes X1 to X3, Y1 to Y3 being connected to the multiplexer 111 and analog switch array 112. The output terminal 111a of said multiplexer 111 is connected with the sensing circuit 115 utilizing the parallel series composite type resonant circuit and the output terminal 115a of it is then followed by the comparator 116 which compares output voltage level with the reference voltage $V_R$. The detecting circuit 115 is composed of the coils $L_a$; $L_b$, capacitor $C_a$ and resistor R. The capacitor $C_a$ and coil $L_a$ form the parallel resonant circuit, while the capacitor $C_b$ representing a body capacitance of operator and the coil $L_b$ form the series resonant circuit. To this sensing circuit 115, an AC signal of the constant frequency (for example, 12.5 kHz) is supplied from the oscillator 117. Said parallel resonant circuit and series resonant circuit are designed in such a manner as tuning to the oscillation frequency of this oscillator.

Said multiplexer 111 is sequentially switched and only one sensing electrode is connected to the sensing circuit 115, the clock signal generator 118 and the 3-bit counter 119 are generating the address signal. The multiplexer 111 having the decoding function connects the sensing electrodes one by one to the sensing circuit 115 in accordance with the state of address signal output sent from the counter 119.

On the other hand, the address signal from the counter 119 is also input to the decoder 113. The address signal is decoded by the decoder 113 and as a result the analog switch array 112 is controlled. The analog switch array 112 operates in such a purpose as connecting all sensing electrodes to the ground potential, except for only one sensing electrode which is being connected to the sensing circuit 115 via the multiplexer 111. Influence of capacitance between electrodes can be alleviated by clamping the non-selected electrodes to the earth potential.

An output of comparator 116 which receives the sensed signal from the sensing circuit 115 is then connected to the one input terminals of a pair of AND gates A1 and A2. The one AND gate A1 outputs the touch signal for the X sensing electrodes when the signal obtained by inverting the address signal via the inverter INV matches the sensed signal. The other AND gate A2 outputs, in the same way, the touch signal for the Y sensing electrodes. The output signals of these AND gates A1 and A2 are respectively output temporarily to the registers 120X, 120Y and stored therein as the address signal at the time when the touch signals are generated. The data stored in these registers 120X and 120Y are read by the output registers 121X, 121Y when the scanning of the one cycle (period) for the X and Y sensing electrodes completes and then sent to the computer as the address information indicating the finger-touched electrode location.

Moreover, the address signal which is an output of the 3-bit counter 119 is input to the ROM (READ Only Memory) having the decoding function in view of realizing capacitance compensation, thanks to the present invention. The ROM 114 previously stores the data for selecting the signal level at the plurality of output terminals to HIGH LEVEL or LOW LEVEL in accordance with the address signal output conditions. The compensating circuit 122 comprises plurality of switch elements and compensating capacitors $C_1$ to $C_4$. The one end of each switch element is connected in common to the output terminal 111a of multiplexer 111, while the other end to the earth via the compensating capacitors $C_1$ to $C_4$. The plurality of output terminals of this ROM 114 are independently connected to the switch elements of compensating circuit 122 and each switch element closes or opens when the output terminal level is selected to HIGH LEVEL or LOW LEVEL. Therefore, when the ROM 114 controls the compensating circuit 122 so that one or plurality of switch elements close in synchronization with the scanning of touch sensing electrodes X1 to X3, Y1 to Y3, compensation is carried out in such a manner that the capacitance values of touch sensing electrodes becomes equal. In this case, it is possible to set the capacitance values of compensating capacitors $C_1$ to $C_4$ in accordance with a degree of fluctuation of capacitances of the sensing electrodes. For example, the compensation in 16 levels is realized by determining the unit compensating value with reference to the minimum compensating capacitance and by setting each capacitance to the ratio of 1:2:4:8. Therefore, capacitance compensation can be realized for all electrodes in any case with the compensating capacitors in such a number as less than the number of touch sensing electrodes.

Figure 2A:
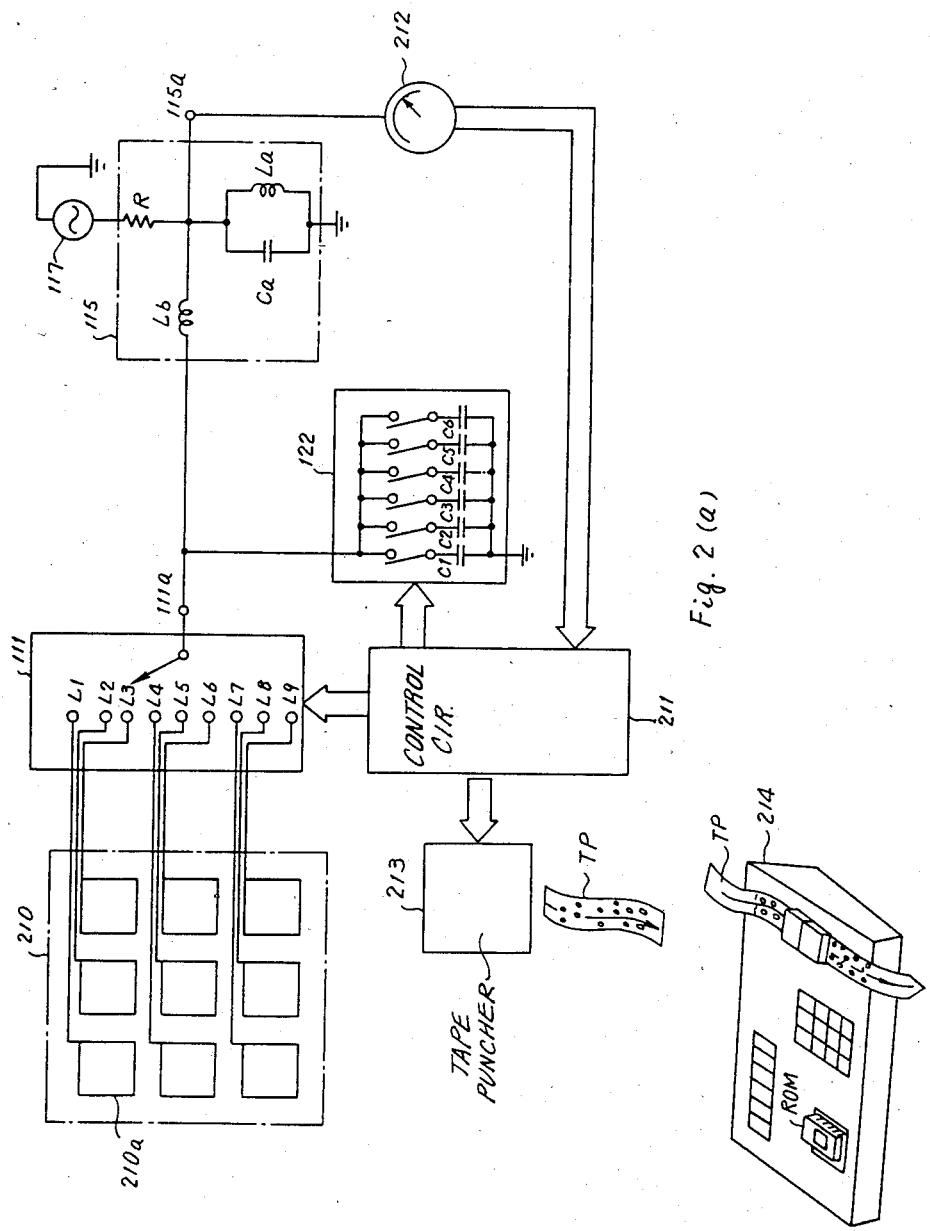
FIG. 2(a) is the block diagram of the circuit for determining data stored in the ROM used in the embodiment shown in FIG. 1.
Figure 2:
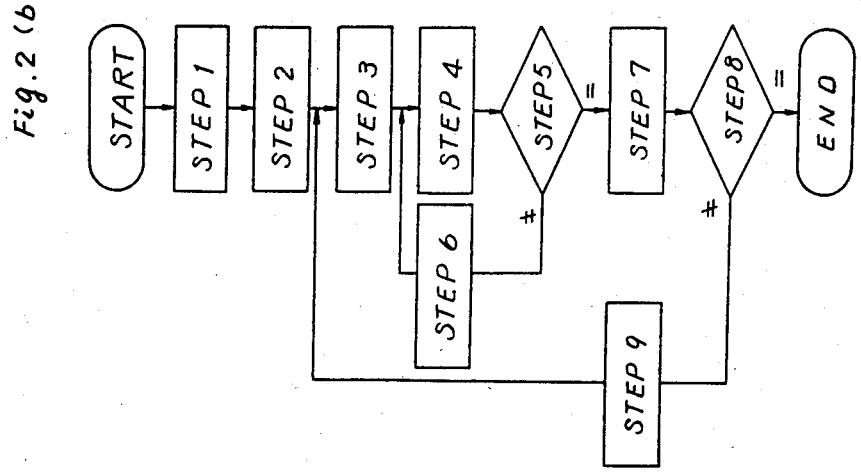
FIG. 2(b) is the flowchart indicating the operation for determining data stored in the ROM used in the embodiment shown in FIG. 2(a).
FIG. 2(c) shows the data stored in the ROM.

FIG. 2(a) is the block diagram of the circuit for determining the data to be stored in the ROM 114 shown in FIG. 1. The touch panel 210 is divided into plurality (in this case, nine sensing electrodes are indicated) of touch areas 210a and each touch area is independently connected to the multiplexer 111. The touch sensing electrodes $L_1$ to $L_9$ corresponding to each touch area is sequentially scanned one by one with the scanning signal sent from the control circuit 211. The output terminal 111a of multiplexer 111 is connected to the sensing circuit 115, while the output terminal 115a of said sensing circuit 115 is connected to the level meter 212. The switch elements of compensating circuit 122 including the compensating capacitance elements $C_1$ to $C_6$ being connected between the output terminal 111a and the earth are controlled for ON and OFF by the control circuit 211. In this case, total of six compensating capacitors respectively have the capacitances of 1 pF, 2 pF, 4 pF, 8 pF, 16 pF and 32 pF, and fluctuation of capacitances from 1 to 63 pF can be compensated by selective combination of these capacitors. The tape puncher 213 punches data sent from the control circuit 211 on the paper tape TP. The data stored on the paper tape is stored in the ROM by the ROM writer 214.

FIG. 2(b) shows the flowchart indicating operations for determining data to be stored in the ROM 114, corresponding to operation of the control circuit 211 shown in FIG. 2(a). The control circuit 211 outputs the scanning signal to the multiplexer 111, causing it to sequentially select the sensing electrodes $L_1$ to $L_9$. Here, it should be noted that the control circuit 211 controls the compensating circuit 122 in such a manner as opening all switch elements (step 1).

The sensing circuit 115 outputs from the output terminal 115a the signals in different voltage levels in synchronization with the scanning by the multiplexer 111. Difference of such voltage levels is resulting from fluctuation of capacitance values of sensing electrodes $L_1$ to $L_9$.

The control circuit 211 stores a level of the level meter 212, when the touch sensing electrode having the maximum capacitance value is selected, among different voltage levels (step 2). Further, the control circuit 211 supplies again the address signal to the multiplexer 111 causing it to select the touch sensing electrode 1 (step 3). At this time, the control circuit 211 gives the address signal also to the compensating circuit 122 in synchronization with supply of the address signal (step 4). This circuit compares, at this time, the level of the level meter 212 with said stored level (step 5). If they do not match, the address signal to the compensating circuit 122 is counted up by one (step 6) and then supplied to the compensating circuit 122 (step 4). In case the level of level meter 212 matches the stored level, such address signal is stored (step 7). When it is judged (step 8) that a cycle of the steps 4, 5, 6 and 7 is performed to all touch sensing electrodes and the compensating data is not set to the touch sensing electrodes because it is not yet completed, the address of address signal to the multiplexer 111 is counted up by one (step 9), followed by a repeat of the steps 3–8. The address signal stored in the step 7 is transferred to the tape puncher 213 and punched on it. Tha data recorded on the tape TP is stored in the ROM by means of the ROM writer 214.

FIG. 2(c) shows a table indicating data stored in the ROM. Moreover this table indicates which compensating capacitor in the compensating circuit is selected in synchronization with the selection of the touch sensing electrode when said touch sensing electrode is selected by the multiplexer and connected to the sensing circuit. For example, it is indicated that when the touch sensing electrode $L_1$ is selected by the multiplexer 111 and is connected to the sensing circuit, the ROM 114 outputs the data to the compensating circuit 122 causing it to select the compensating capacitors $C_1$, $C_2$, $C_3$ and $C_4$. Namely, when the capacitance of electrode $L_1$ is 25 pF, compensating capacitance of 15 pF in total is added to such capacitance through combination of the compensating capacitors $C_1$, $C_2$, $C_3$ and $C_4$ in order to set it to the reference capacitance, the maximum electrode capacitance of 40 pF (capacitance of sensing electrode $L_4$. In the case of FIGS. 2(a) and (b), only nine sensing electrodes are indicated for simplifying the circuit, but the panel actually provides several tens of electrodes or more corresponding to the characters or items on the display screen and capacitance compensation is carried out corresponding to these electrodes.

Figure 3:
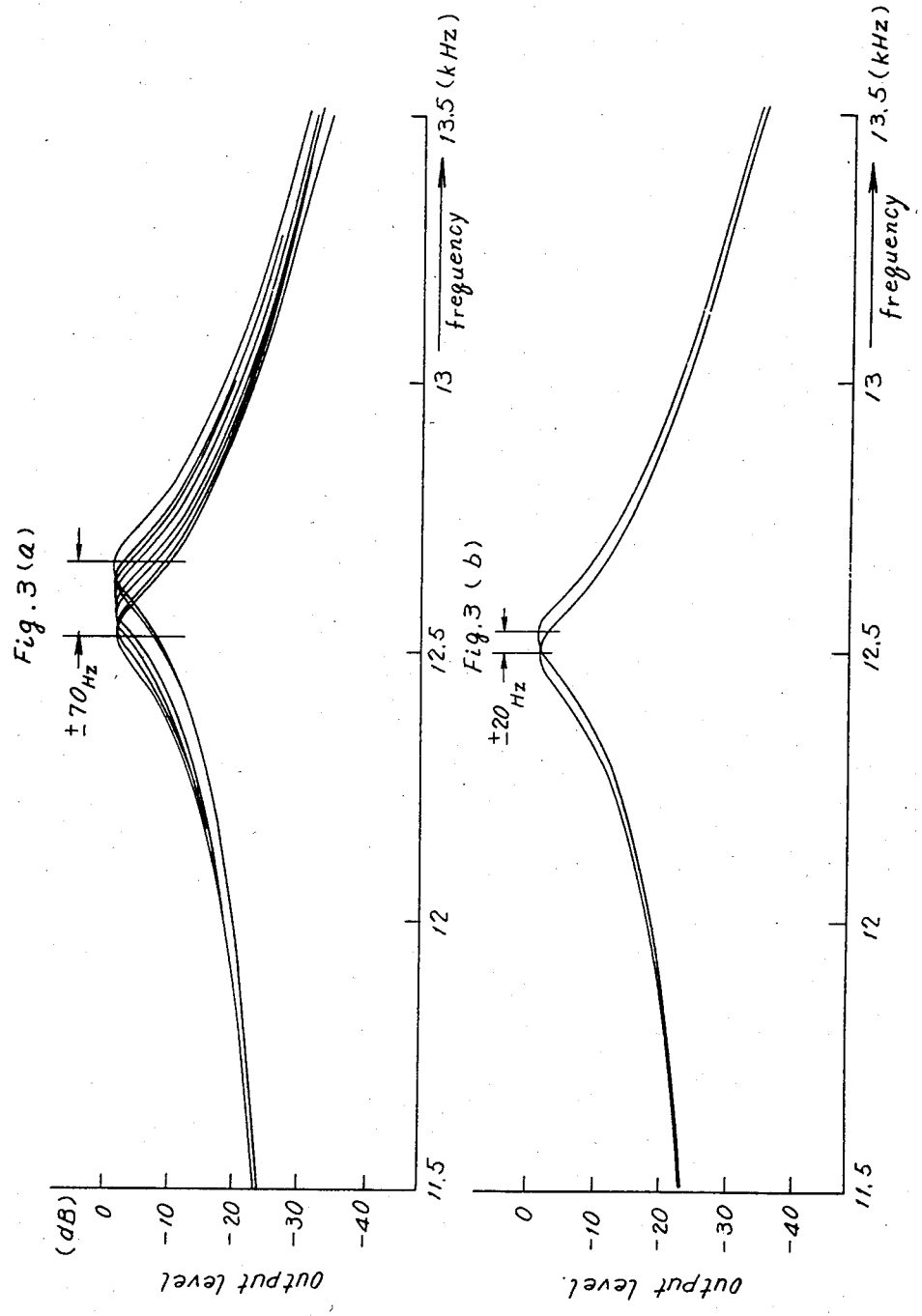
FIG. 3(a) shows the characteristics indicating the relation between the frequency and sensed voltage level obtained before the capacity of each touch sensing electrode is compensated.
FIG. 3(b) shows the characteristics indicating the relation between the frequency and sensed voltage level of the embodiment of FIG. 1.

FIG. 3(a) shows the characteristic obtained when the relation between output voltage level and frequency is measured for the panel, for example, providing 50 sensing electrodes, where fluctuation of capacitance values of touch sensing electrodes is not compensated. Namely, the resonant frequencies of the sensing electrodes differ respectively for each electrode due to fluctuation of capacitance values of touch sensing electrodes and difference between the maximum resonant frequency and the minimum resonant frequency becomes a value as high as almost 140 (Hz).

FIG. 3(b) shows the characteristic indicating the relation between output voltage and frequency obtained when the capacitance compensation is carried out in such a manner as shown in FIG. 1 to the same sensing panel as that of FIG. 3(a). Namely, fluctuation of capacitance values of 50 touch sensing electrodes is compensated by the compensating circuit. Since the capacitance values of touch sensing electrodes are controlled by the ROM 114 so that they become equal, the resonant frequencies of touch sensing electrodes can be set within the range of 20 (Hz). Therefore, the ON-OFF ratio which is defined as the ratio of the output voltage levels in the touch and non-touch states can be set uniformly in each electrode, sensing the touch operation with high accuracy.

Figure 4:
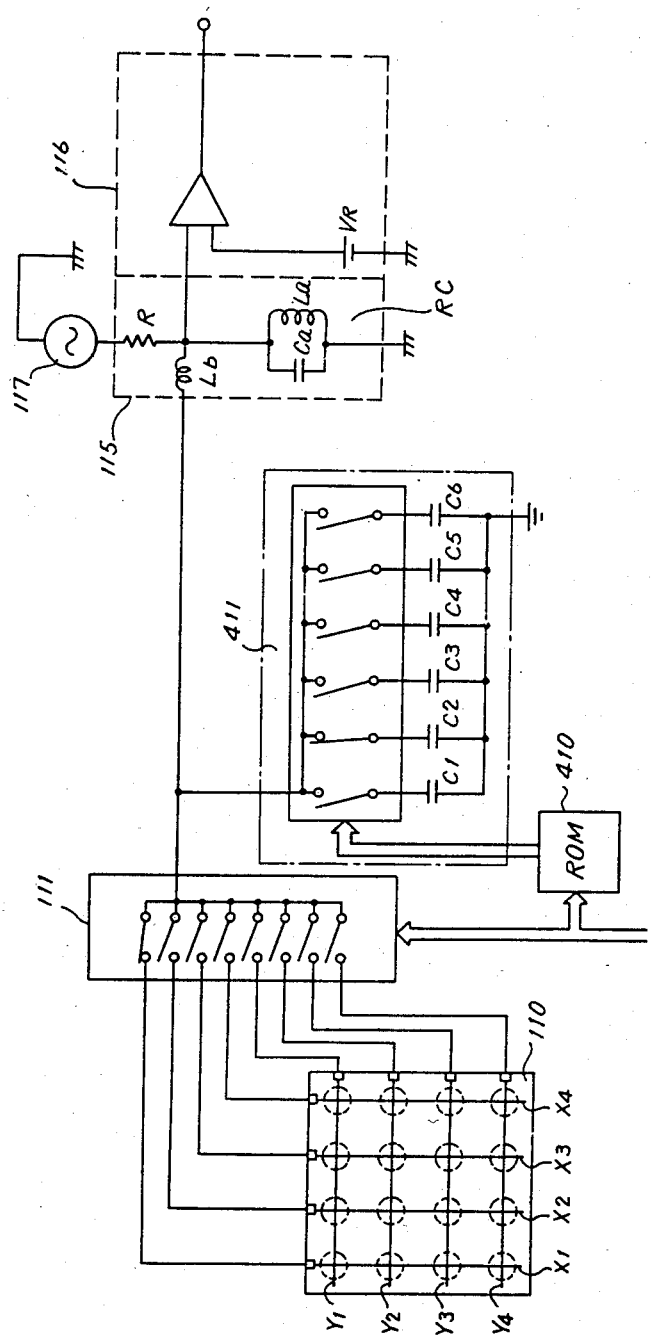
FIG. 4 is the block diagram illustrating the second embodiment of the touch sensing device to which the present invention is applied.

FIG. 4 is the block diagram indicating the second embodiment of the touch sensing device to which the present invention is applied.

This embodiment is the same as the embodiment shown in FIG. 1 in such a point that the address signal which is input to the multiplexer 111 for the sequential scanning of the touch location sensing electrodes is input to the ROM 410 and the compensating circuit 411 is controlled in accordance with the output condition of such address signal.

However, the ROM 410 controls the compensating circuit 411 in such a manner as selecting only one compensating capacitor. Namely, when one of the touch sensing electrodes is selected by the multiplexer 111, the ROM 410 outputs data so that a switch element corresponding to only one capacitor predetermined among plurality of compensating capacitors $C_1$ to $C_6$ in the compensating circuit 411 turns ON. In case many sensing electrodes are provided and capacitances of electrodes are fluctuating in a wider range, it is advantageous to set the compensating capacitance through the combination of compensating capacitors shown in the embodiment of FIG. 2(a), but in case electrode capacitances fluctuate within a narrow range, it is profitable that plurality of compensating capacitors $C_1$ to $C_6$ having different capacitances are prepared as shown in FIG. 4 and any one of them is selected corresponding to each electrode.

FIG. 5 is the block diagram indicating the third embodiment of the touch sensing device to which the present invention is applied. In the case of this method, plurality of touch sensing electrodes are divided into plurality of blocks, the touch operation is first detected in unit of block in order to detect the touch to the touch sensing electrode. Then, scanning is carried out only for the limited touch sensing electrode within one block in view of raising the retrieval rate. Therefore, the address control circuit 521 supplies the address signal to the analog switch array 510. This address signal selects one sub-analog switch array from n-sub-analog switch arrays 511 to 51n. Thus, five switches of the selected sub-analog switch array are controlled by the another address signal supplied in common to each sub-analog switch array. The remaining non-selected sub-analog switch arrays are all connected to the earth terminal through the switches. The address signal supplied from the address control circuit 521 in common to each sub-analog switch array controls five switches, in accordance with the output state, whether five switches are all connected to the output terminals or they are connected sequentially to the output terminal one by one. The multiplexer 520 connects any one of the block sensing electrodes $L_1$ to $L_n$ to the output terminal 520a in accordance with the output condition of address signal sent from the address control circuit 521. The ROM 114 is controlled by the address signal sent from the address control circuit 521 in such a way as selecting the compensating capacitor in the compensating circuit 122 in synchronization with the address signal of the sub-analog switch array, analog switch array and multiplexer. Thereby, it is possible to make identical the capacitance value when five touch sensing electrodes are connected to the sensing circuit 115 for selection of block to the capacitance value when a single sensing electrode is connected to the sensing circuit in order to sense the block by means of the compensating capacitors $C_1$ to $C_6$ of the compensating circuit 122.

As is understood from above explanation, according to the present invention, fluctuation of capacitance values of touch sensing electrodes is compensated by the compensating capacitors common to the touch sensing electrodes. Thereby brought about is such advantage that the sensing sensitivity of sensing circuit can be improved and when the present invention is applied to the see-through type touch input device or touch keyboard, accurate and stable input can be designated. In addition, according to the present invention, capacitance compensation can be realized by simplified procedures and device cost can also be lowered remarkably as compared with the method of connecting individual compensating capacitors to the corresponding sensing electrodes.

We claim:

1. In a touch sensing device comprising a plurality of sensing electrodes positioned to correspond to locations to be sensed, and a sensing circuit for sensing when a selected one of said sensing electrodes is activated, wherein said sensing circuit senses the activation of a sensing electrode by sensing a change in the electrical characteristics of said sensing electrode when said sensing electrode is activated, the improvement comprising a compensating circuit means for compensating for fluctuations in the electrical characteristics of each sensing electrode, said compensating circuit means comprising a plurality of compensating elements, wherein the number of said compensating elements is less than the number of said sensing electrodes; memory means for storing data for selecting predetermined ones of said compensating elements for providing the compensation required for each of said sensing electrodes; and connecting means coupled to said compensating elements and to said memory means for connecting said predetermined ones of said compensating elements to said sensing circuit, whereby the fluctuations of the electrical characteristics of said activated sensing element sensed by said sensing circuit, is compensated for.

2. A touch sensing device according to claim 1, wherein said sensing circuit comprises an oscillator, a parallel resonant circuit, tuned to the frequency of said oscillator and an impedance element connecting said oscillator to said resonant circuit, wherein said compensating circuit is connected to the connecting point of said parallel resonant circuit and impedance element.

3. A touch sensing device according to claim 1, wherein said compensating elements are capacitors.

4. A touch sensing device according to claim 3, where the unit compensating value of said sensing elements is determined with reference to the minimum compensating capacitance and the capacitance value of each capacitor is set to $2^n$ times of the unit compensating value, respectively, where $n = 0, 1, 2, \ldots$.

* * * * *